(12) United States Patent
Paik

(10) Patent No.: US 7,521,303 B2
(45) Date of Patent: Apr. 21, 2009

(54) METHOD OF CRYSTALLIZING AMORPHOUS SEMICONDUCTOR THIN FILM AND METHOD OF FABRICATING POLY CRYSTALLINE THIN FILM TRANSISTOR USING THE SAME

(76) Inventor: Woon Suh Paik, 577-1 I-dong, Sangnok-gu, Ansan-si, Gyeonggi-do (KR)

( * ) Notice: Subject to any disclaimer, the term of this patent is extended or adjusted under 35 U.S.C. 154(b) by 381 days.

(21) Appl. No.: 11/146,038

(22) Filed: Jun. 7, 2005

(65) Prior Publication Data

US 2006/0121655 A1 Jun. 8, 2006

(30) Foreign Application Priority Data

Dec. 3, 2004 (KR) .................... 10-2004-0100887

(51) Int. Cl.
*H01L 21/20* (2006.01)
*H01L 21/84* (2006.01)
(52) U.S. Cl. .................. 438/166; 438/482; 438/486; 438/491; 257/E21.133
(58) Field of Classification Search .............. 257/ E21.133–E21.135; 438/149–151, 163, 166, 438/482, 486, 491
See application file for complete search history.

(56) References Cited

U.S. PATENT DOCUMENTS 6,194,255 B1 * 2/2001 Hiroki et al. .............. 438/166
6,281,057 B2 * 8/2001 Aya et al. .................. 438/166
2003/0148567 A1 * 8/2003 Joo et al. .................. 438/200
2004/0110329 A1 * 6/2004 Joo et al. .................. 438/166
2005/0110022 A1 * 5/2005 Kim et al. ................... 257/72

* cited by examiner

*Primary Examiner*—Douglas M Menz
*Assistant Examiner*—Matthew W Such
(74) *Attorney, Agent, or Firm*—Rosenberg, Klein & Lee

(57) ABSTRACT

A method of crystallizing an amorphous semiconductor thin film used for a thin film transistor (TFT) is provided. The method includes the steps of: forming first and second crystallization induced metal patterns locally in respective portions of a source region and a drain region of the TFT on an amorphous semiconductor thin film; and crystallizing an amorphous semiconductor via independent two-times heat treatment using the first and second crystallization induced metal patterns. In this case, the independent two-times heat treatment is executed before and after ions of impurities are injected, respectively. In this way, a metal induced lateral crystallization double heat treatment is executed before and after ions of impurities are injected, respectively. As a result, the entire crystallization heat treatment time necessary for crystallizing the amorphous semiconductor thin film can be greatly reduced, and a poly-crystalline TFT having low leakage current can be obtained.

8 Claims, 10 Drawing Sheets

METHOD OF CRYSTALLIZING AMORPHOUS SEMICONDUCTOR THIN FILM AND METHOD OF FABRICATING POLY CRYSTALLINE THIN FILM TRANSISTOR USING THE SAME

BACKGROUND OF THE INVENTION

1. Field of the Invention

The present invention relates to a method of crystallizing an amorphous semiconductor thin film, and a method for fabricating a poly-crystalline thin film transistor using the same, and more particularly, to a method of crystallizing an amorphous semiconductor thin film, and a method for fabricating a poly-crystalline thin film transistor using the same, in which independent two-times heat treatments are executed before and after impurities are ion-injected when a low-temperature poly-crystalline thin film transistor is fabricated via a metal induced lateral crystallization method or the other corresponding methods, to thereby shorten a heat treatment time.

2. Description of the Related Art

In general, a thin film transistor which is used in a display device such as a liquid crystal display (LCD) or an organic light emitting diode (OLED) is fabricated by processes of depositing an amorphous semiconductor thin film transistor made of semiconductor thin film on a transparent substrate such as glass or quartz, forming a gate insulation film and a gate electrode, injecting a dopant into a source and a drain, and then annealing the dopant-injected source and drain to thereby activate the injected dopant and to then form an interlayer insulation layer. An active layer (that is, a semiconductor layer) forming a source, a drain and a channel of a thin film transistor is formed by depositing an amorphous semiconductor thin film layer on a transparent substrate using a CVD (Chemical Vapor Deposition) method.

In this case, a semiconductor thin film layer directly deposited on a substrate by the CVD method and so on is an amorphous semiconductor thin film having a low electron mobility. By the way, as a display device using a thin film transistor gradually requires for a fast operating speed and becomes compact in size, a degree of integration of a driving integrated circuit (IC) becomes large and an aperture ratio of a pixel region becomes reduced. Accordingly, electron mobility on a semiconductor thin film made of silicon should be heightened so that a driving circuit is formed simultaneously together with a pixel thin film transistor (TFT), and an aperture ratio of each pixel should be heightened. For this purpose, a poly-crystallization poly-semiconductor thin film technology having higher electron mobility than that of an amorphous layer is under study.

In general, in order to obtain a poly-crystalline semiconductor thin film to be used as a semiconductor layer in a thin film transistor, an amorphous semiconductor thin film made of silicon is deposited on a substrate, and then the amorphous semiconductor thin film is heat-treated at a predetermined temperature, to thus crystallize the amorphous semiconductor thin film into a poly-crystalline semiconductor thin film. A metal induced lateral crystallization (MILC) method, a solid phase crystallization (SPC) method, and an excimer laser annealing (ELA) method can be used as the amorphous semiconductor thin film crystallization method.

Among them, the MILC method has a number of merits of having a relatively low processing temperature and a relatively short processing time as well as using a conventional heat treatment facility such as a tubular furnace.

A conventional method of fabricating a poly-crystalline thin film transistor using a MILC method will follow.

FIGS. 1A through 1E are cross-sectional views for explaining a conventional poly-crystalline thin film transistor fabrication method using a MILC method, respectively.

Referring to FIG. 1A, an amorphous silicon film is formed on an insulation substrate 10, and then the amorphous semiconductor thin film is patterned using a semiconductor layer formation mask (not shown), to thereby form a semiconductor layer 11.

Referring to FIG. 1B, a gate insulation film, and a gate electrode metal substance are sequentially deposited on the substrate, and patterned using a gate formation mask (not shown), to thereby form a gate electrode 13 and a gate insulation film 12.

Then, as shown in FIG. 1C, a photosensitive film pattern 14 slightly larger than the gate pattern is formed on the substrate 10, using an off-set mask (not shown), and a crystallization induced metal film 15 for MILC (hereinafter, referred to as a MILC metal film) such as Ni is deposited on the entire surface of the substrate.

Referring to FIG. 1D, the photosensitive film pattern 14 is removed by using a lift-off method, and thus the gate electrode 13 and off-set portions 11a and 11b in the semiconductor layer 11 are exposed. Then, high-concentration impurities are injected to form a source region 11S and a drain region 11D as shown in FIG. 1E.

Thereafter, a MILC heat treatment is performed on the substrate at a temperature between 400° C. through 600° C. under the atmosphere of an inert gas, hydrogen, or vacuum, to thereby crystallize the amorphous silicon film into a poly-crystalline silicon film. In this case, a portion contacting the metal film 15 is crystallized by a metal induced crystallization (MIC) method, and an off-set portion and a channel region 11C located below the gate insulation film which do not contact the metal film 15 are crystallized by the MILC method.

Referring to FIG. 1F, an interlayer insulation film 16 is deposited on the substrate and then contact holes 17 are formed with respect to the gate electrode 13, the source region 11S and the drain region 11D by using a contact formation mask (not shown). Then, a metal film for metal wiring is deposited and then patterned using a metal formation mask (not shown) to thereby form a metal wiring pattern 18.

As described above, in the case of the conventional thin film transistor fabrication method, a crystallization-induced metal is directly deposited on active layer, i.e., amorphous silicon film, and then heat-treated. Accordingly, a portion just below the metal deposited portion is crystallized by a MIC method which crystallizes a silicon film in which silicide made on an upper surface proceeds downwards, while a side portion where a crystallization induced metal is not deposited is crystallized by a MILC method which crystallizes the silicon in which the silicide is transferred laterally.

Here, if a crystallization induced metal remaining without reacting as silicide is included in the MIC region and the MILC region, a feature such as an increase of leakage current is deteriorated. In particular, since a crystallization induced metal is deposited on the upper portion of a source/drain region, which is near a silicon-oxide film boundary surface, which greatly influences upon a transistor feature, this feature deterioration effect becomes larger.

Meanwhile, since according to one published paper, metal pollution occurring due to a crystallization induced metal deposited on the silicon surface for the conventional MILC exists in the channel region of the poly-crystalline thin film transistor, it has been reported that a problem for deteriorating an electrical feature of a device has been known (see IEEE Trans. Electron Devices, Vol. 40, No. 5, p. 404, 1993).

Thus, in order to solve the problem, metal remaining after having formed silicide should be removed, or a crystallization induced metal should be processed so that no remaining metal exists if possible.

Meanwhile, it has been known that an amorphous silicon thin film doped with N-type impurities is generally much slower than an intrinsic silicon thin film, in view of a crystallization speed when an amorphous silicon thin film is crystallized. Thus, when an N-type poly-crystalline thin film transistor is fabricated, a heat treatment time necessary for crystallization becomes very long. Accordingly, in the case of a CMOS (Complementary Metal-Oxide Semiconductor) device where N-type and P-type thin film transistors to be widely used for a display driving IC (Integrated Circuit) exist simultaneously, a processing time becomes long and thus a processing cost increases when a poly-crystalline thin film transistor device is fabricated.

Thus, in the case of the poly-crystalline thin film transistor where N-type and P-type thin film transistors exist simultaneously, a heat treatment time necessary for crystallizing an N-type poly-crystalline thin film transistor should be shortened in order to reduce a total of heat treatment time and thus heighten a productivity.

SUMMARY OF THE INVENTION

To solve the above problems, it is an object of the present invention to provide a method of crystallizing an amorphous semiconductor thin film which can reduce a total of heat treatment time of a thin film transistor, by primarily heat treating a source/drain before impurities are doped into the source/drain in order to perform primary crystallization, and doping the impurities into the source/drain to then perform secondary crystallization.

It is another object of the present invention to provide a method of crystallizing an amorphous semiconductor thin film which prevents a surface roughness from worsening and a trap site from being formed due to a mechanical stress between a semiconductor layer and a gate insulation film and can reduce a total of heat treatment time of a thin film transistor, by crystallizing the entire semiconductor layer at the time of a primary heat treatment before impurities are doped and activating the injected impurities at the time of a secondary heat treatment after the impurities have been doped.

It is still another object of the present invention to provide a method of crystallizing an amorphous semiconductor thin film using a MILC (Metal Induced Lateral Crystallization) method which can prevent a remaining crystallization induced metal which is not changed into silicide from diffusing onto a semiconductor thin film surface being an operational region of a transistor, by forming a MILC crystallization induced metal is formed on a substrate in advance before an amorphous semiconductor thin film is formed.

It is yet another object of the present invention to provide a method of crystallizing an amorphous semiconductor thin film and a method of fabricating a thin film transistor, which can form a LDD (Lightly Doped Drain) structure which can lower leakage current without having an additional mask process or a separate process, by performing a double heat treatment onto the substrate before and after impurities are doped.

It is a further object of the present invention to provide a method of fabricating a thin film transistor using the amorphous semiconductor thin film crystallization method.

To accomplish the above object of the present invention, according to a first aspect of the present invention, there is provided a method of crystallizing an amorphous semiconductor thin film, the amorphous semiconductor thin film crystallizing method comprising the steps of: forming first and second crystallization induced metal patterns locally in respective portions of a source region and a drain region of a thin film transistor (TFT) on an amorphous semiconductor thin film; and crystallizing an amorphous semiconductor via independent two-times heat treatment using the first and second crystallization induced metal patterns.

In this case, the independent two-times heat treatment is executed onto the substrate before and after ions of impurities are injected, respectively.

According to a second aspect of the present invention, there is provided a method of crystallizing an amorphous semiconductor thin film formed on a substrate, the amorphous semiconductor thin film crystallizing method comprising the steps of: forming first and second crystallization induced metal patterns which are spaced by a predetermined distance from each other on the amorphous semiconductor thin film and induces an amorphous semiconductor to be crystallized; injecting impurities into the substrate to define a source region and a drain region; and performing a heat treatment on the substrate before and after impurities are injected into the substrate, respectively.

In this case, the first and second crystallization induced metal patterns are locally formed in respective portions of the source region and the drain region, and at least a channel region located between the source region and the drain region is left and the other portions are partially crystallized at the time of a primary heat treatment which is performed before the impurities are ion-injected into the substrate.

In addition, the entire amorphous semiconductor thin film is crystallized at the time of a primary heat treatment which is performed before impurities are injected into the substrate and a secondary heat treatment which is performed after impurities are injected into the substrate is executed in order to activate the injected impurities.

According to a third aspect of the present invention, there is provided a method of crystallizing an amorphous semiconductor thin film formed on a substrate, the amorphous semiconductor thin film crystallizing method comprising the steps of: forming first and second crystallization induced metal patterns which are spaced by a predetermined distance from each other on the amorphous semiconductor thin film, and induces an amorphous semiconductor to be crystallized; injecting impurities into the substrate to define a source region and a drain region; and performing a heat treatment on the substrate before and after impurities are injected into the substrate, respectively.

In this case, it is preferable that the first and second crystallization induced metal patterns are locally formed in a part of respective portions where the source region and the drain region are formed, and only a part of the amorphous semiconductor thin film is crystallized at the time of a primary heat treatment which is performed before the impurities are ion-injected into the substrate.

In addition, the entire amorphous semiconductor thin film is crystallized at the time of a primary heat treatment which is performed before impurities are injected into the substrate and a secondary heat treatment which is performed after impurities are injected into the substrate is executed in order to activate the injected impurities.

According to a fourth aspect of the present invention, there is provided a method of crystallizing an amorphous semiconductor thin film, the amorphous semiconductor thin film crystallizing method comprising the steps of: forming an amorphous semiconductor thin film on a substrate; forming at least one crystallization induced metal pattern on the upper portion of the amorphous semiconductor thin film; performing a primary heat treatment on the substrate, to thus primarily crystallize a part of the lower portion and a lateral surface of the amorphous semiconductor thin film surrounded by the crystallization induced metal pattern via a MIC (Metal Induced Crystallization) method and a MILC (Metal Induced Lateral Crystallization) method, respectively, as a primary crystallization step; selectively injecting impurities into the substrate to thus form a source region and a drain region; and performing a secondary heat treatment on the substrate to thus secondarily crystallize the amorphous semiconductor thin film remaining as an amorphous state via the MILC method, as a secondary crystallization step.

In this case, the amorphous semiconductor thin film crystallizing method further comprises the steps of: sequentially forming an insulation film and a conductive metal film on the substrate before the crystallization induced metal patterns are formed; and sequentially patterning the insulation film and the conductive metal film to form a gate electrode and a gate insulation film, in which it is preferable that impurities are selectively ion-injected using the gate electrode as a mask at the step of forming the source region and the drain region by ion-injecting impurities into the substrate.

In addition, the amorphous semiconductor thin film crystallizing method further comprises the steps of: sequentially forming an insulation film and a conductive metal film on the substrate after the crystallization induced metal patterns are formed; and sequentially patterning the insulation film and the conductive metal film to form a gate electrode and a gate insulation film, in which the gate electrode and the gate insulation film are formed to coincide with the amorphous semiconductor thin film which is not crystallized by a primary crystallization step between a pair of the crystallization induced metal patterns but is still left as an amorphous state, and the amorphous semiconductor thin film is crystallized except for a channel region defined as a region between the source region and the drain region at the primary crystallization step. As a result, the source region and the drain region include a LDD (Lightly Doped Drain) structure composed of a region crystallized before ion-injection is performed and a region crystallized after ion-injection is performed.

Also, the step of forming the at least one crystallization induced metal pattern comprises the steps of: forming a photosensitive film on the entire surface of the substrate; forming a pair of contact holes on the photosensitive film in order to expose a part of regions where a source and a drain are formed as semiconductor layers; forming the crystallization induced metal on the entire surface of the substrate; and removing the photosensitive film by a lift-off method to thus make the crystallization induced metal pattern contacting a part of the source and drain regions remain.

In this case, the pair of contact holes formed on the photosensitive film can be formed using a contact mask for forming contact holes for the source and drain regions.

Also, the crystallization induced metal pattern is spaced by a predetermined distance from the gate insulation film, and the entire amorphous semiconductor thin film is crystallized at the time of a primary heat treatment which is performed before impurities are injected into the substrate and a secondary heat treatment which is performed after impurities are injected into the substrate is executed in order to activate the injected impurities.

According to a fifth aspect of the present invention, there is provided a method of crystallizing an amorphous semiconductor thin film, the amorphous semiconductor thin film crystallizing method comprising the steps of: forming at least one crystallization induced metal pattern on the upper portion of a substrate; forming a semiconductor layer composed of an amorphous semiconductor thin film on the substrate so that the crystallization induced metal pattern is included therein; performing a primary heat treatment on the substrate, to thus primarily crystallize a part of the lower portion and a lateral surface of the semiconductor layer located on the upper portion of the crystallization induced metal pattern via a MIC (Metal Induced Crystallization) method and a MILC (Metal Induced Lateral Crystallization) method, respectively, as a primary crystallization step; injecting impurities into the substrate to thus form a source region and a drain region; and performing a secondary heat treatment on the substrate to thus secondarily crystallize the semiconductor layer remaining as an amorphous state via the MILC method, as a secondary crystallization step.

In this case, it is preferable that thickness of the crystallization induced metal is established so that the entire crystallization induced metal pattern is made into silicide as the primary crystallization step is executed.

As described above, according to the present invention, a seed pattern composed of a crystallization induced metal is formed in advance within a region where a source and a drain are formed. Thereon, an amorphous semiconductor layer is formed and then crystallized and heat treated so that the entire crystallization induced metal is made into silicide completely. Here, as silicide is formed from the crystallization induced metal, a remaining metal is minimized so that it is not left over. Also, since the crystallization induced metal is formed below the semiconductor to thereby structurally minimize an influence upon the surface being an operating region of a transistor, a problem of deteriorating an electrical feature of a semiconductor device due to pollution of the remaining metal can be solved.

According to a sixth aspect of the present invention, there is provided a method of fabricating a poly-crystalline semiconductor thin film transistor, the poly-crystalline semiconductor thin film transistor fabrication method comprising the steps of: depositing an amorphous semiconductor thin film on a transparent insulation substrate, and then patterning the deposited semiconductor thin film to thereby form an island-shaped semiconductor layer; sequentially forming an insulation film and a electrode metal film on the substrate, and then sequentially patterning the insulation film and the electrode metal film, to thereby form a gate electrode and a gate insulation film; forming first and second crystallization induced metal patterns on a part of a source region and a drain region in the semiconductor layer; crystallizing a part of the source region and the drain region by a primary MILC (Metal Induced Lateral Crystallization) heat treatment method, using the first and second crystallization induced metal patterns; ion-injecting impurities into the source region and the drain region; and crystallizing a non-crystallized region among the source and drain regions by a secondary MILC heat treatment method, and a channel region located between the source and drain regions, and activating the ion-injected impurities.

Meanwhile, a metal induced lateral crystallization (MILC) speed of a N-type doped silicon thin film is much slower than that of an intrinsic silicon thin film. However, according to the present invention, a metal induced crystallization (MIC) method is partially executed with respect to a source region and a drain region in an intrinsic state silicon thin film, and then N-type impurities are ion-injected to thereby form an N-type silicon. In this state, if a MILC method is executed, the crystallization speed does not become slow by the ion-injected N-type impurities. The same applicant as that of the present invention has found this new fact.

Accordingly, a partial crystallization is accomplished before ion-injection is performed through deposition of a crystallization induced metal on part of the source and drain regions. Thereafter, at the state where an N-type source region and an N-type drain region are formed by ion-injection, a secondary heat treatment is executed in order to activate the injected ions and to complete crystallization of the source and drain regions and a channel region. Accordingly, crystallization with respect to the amorphous semiconductor layer can be generally performed at a very high speed. As a result, an N-type thin film transistor can be easily formed by using a double heat treatment method according to the present invention.

Thus, according to the first through sixth aspects of the present invention, crystallization with respect to the amorphous semiconductor layer can be performed at a high speed even in the case that the substrate includes all of the N-type and P-type impurities injection regions.

Also, in the present invention, a portion where a gate is to be formed on an amorphous semiconductor thin film is predicted, before a gate insulation film and a gate electrode metal film are formed, and a crystallization induced metal is locally formed in a portion where a source region and a drain region are to be formed, to thereby execute a primary heat treatment, and to thus transform the amorphous semiconductor thin film of the source and drain regions into a crystallized semiconductor thin film. Thereafter, at the state where a gate insulation film and a gate metal film are formed, N-type impurities are ion-injected, to then execute a secondary heat treatment to thus transform the amorphous semiconductor thin film into a crystallized semiconductor thin film. Accordingly, a total heat treatment time can be shortened.

Further, according to the present invention, at the state where a crystallization induced metal seed is formed below the amorphous semiconductor thin film, a primary heat treatment is executed to transform the amorphous semiconductor thin film into a poly-crystalline semiconductor thin film, and then at the state where a gate insulation film and a gate electrode are formed, and N-type impurities are ion-injected, a secondary heat treatment is executed to transform the amorphous semiconductor thin film into a crystallized semiconductor thin film. Accordingly, a total heat treatment time can be shortened.

In addition, in the case that the above-described heat treatment method is used, a time taken for manufacturing a thin film transistor can be greatly reduced.

BRIEF DESCRIPTION OF THE DRAWINGS

The above and other objects and advantages of the present invention will become more apparent by describing the preferred embodiments thereof in detail with reference to the accompanying drawings in which.

DETAILED DESCRIPTION OF THE INVENTION

A preferred embodiment of the present invention will be described with reference to the accompanying drawings.

FIGS. 2A through 2F are cross-sectional views for explaining a method of fabricating a thin film transistor using a MILC method according to a first preferred embodiment of the present invention.

Figure 2A:
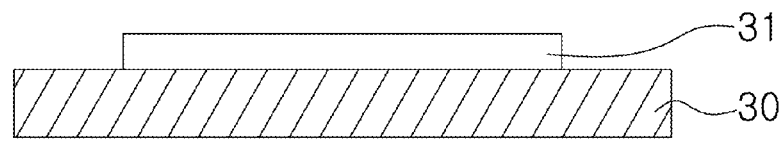
FIGS. 2A through 2F are cross-sectional views for explaining a method of fabricating a thin film transistor using a MILC method according to a first preferred embodiment of the present invention.

First, referring to FIG. 2A, an amorphous semiconductor thin film, for example, an amorphous silicon film is deposited on a transparent insulation substrate 30, and then patterned using a mask (not shown) for forming a semiconductor layer, to thereby form a semiconductor layer 31 used as an active layer.

Figure 2B:
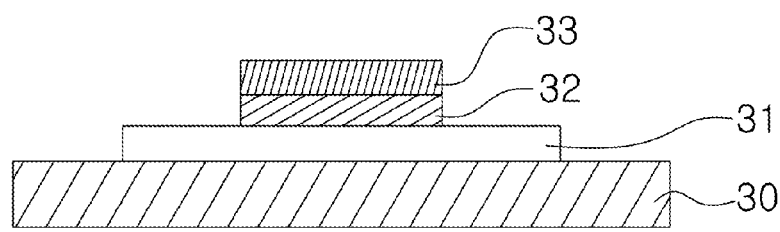

Then, as shown in FIG. 2B, a gate oxide film and a gate electrode metal material are sequentially formed on the insulation substrate 30, and then patterned using a gate formation mask (not shown), to thereby form a gate electrode 33 and a gate insulation film 32.

Figure 2C:
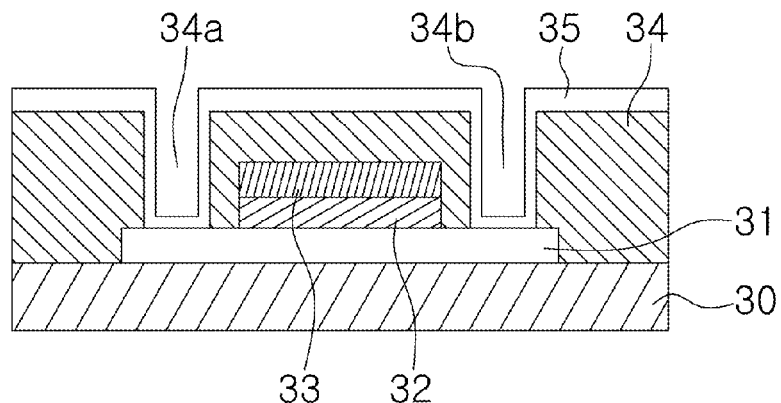

Then, as shown in FIG. 2C, a photosensitive film pattern 34 having contact holes 34a with respect to a source region and a drain region is formed on the substrate 30 using a contact mask (not shown), and then a MILC metal film 35 is deposited on the entire surface of the substrate 30. As a result, the MILC metal film 35 contacts partially the source and drain regions via the contact holes 34a.

The MILC metal film 35 is deposited with a thickness of 10~10,000 Å, preferably, 10~200 Å, for example, 50 Å, on the insulation substrate 30, by any one of sputtering, evaporation by heating, PECVD (Plasma Enhanced Chemical Vapor Deposition), and a solution coating. Here, as the applicable material of the metal film 35 is any one selected from the group consisting of Ni, Pd, Ti, Ag, Au, Al, Sn, Sb, Cu, Co, Cr, Mo, Tr, Ru, Rh, Cd, and Pt.

Figure 2D:
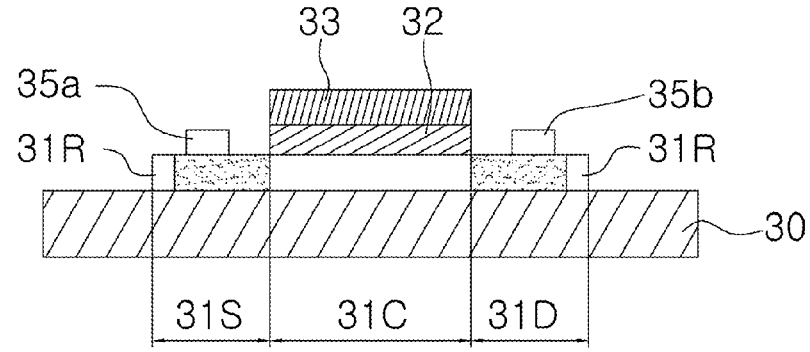

Then, if the photosensitive film pattern 34 is removed from the insulation substrate 30 by a lift-off method, only MILC metal films 35a and 35b partially contacting the source and drain regions 31S and 31D remain as shown in FIG. 2D, and the other metal films are removed, to thereby have the upper surface of the substrate exposed. The remaining MILC metal films 35a and 35b play a role of seeds for MILC.

In this state, the substrate is primarily heat-treated for one hour at a temperature of 400 through 600° C., for example, at a temperature of 580° C. Accordingly, part of the semiconductor layer 31 made of an amorphous silicon, that is, the lower portion of the MILC metal films 35a and 35b are crystallized by the MIC method, and part of the exposed semiconductor layer 31 is crystallized by the MILC method. That is, a pattern length, a formation position, and a heat treatment time of the MILC metal films 35a and 35b are established so that the channel region 31C below the gate insulation film 32 and the outer shell portion 31R of the semiconductor layer 31 remain as an amorphous silicon state. Then, the remaining MILC metal films 35a and 35b which react with the silicon by the heat treatment but are not transformed into silicide are removed.

Figure 2E:
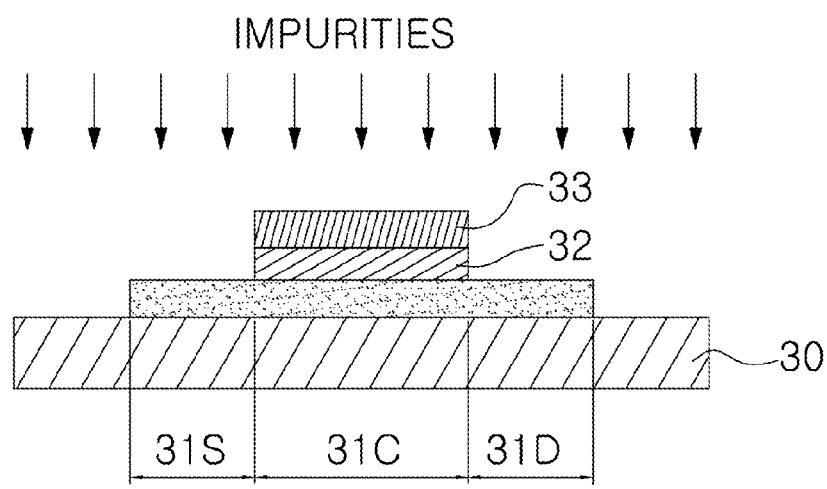

Referring to FIG. 2E, high-concentration impurities, for example, P (in case of an N-type) or B (in case of a P-type) is ion-injected using the gate electrode 33 and the gate insulation film 32 as masks to thereby form the source region 31S and the drain region 31D.

Then, the substrate is secondarily heat-treated for one hour by the MILC method, at a temperature of 400 through 600° C., for example, at a temperature of 580° C. Accordingly, the MILC crystallization is completed for the channel region 31C and the outer shell portion 31R of the semiconductor layer 31 which remain as an amorphous silicon state, and the ion-injected dopant is activated.

Figure 2F:
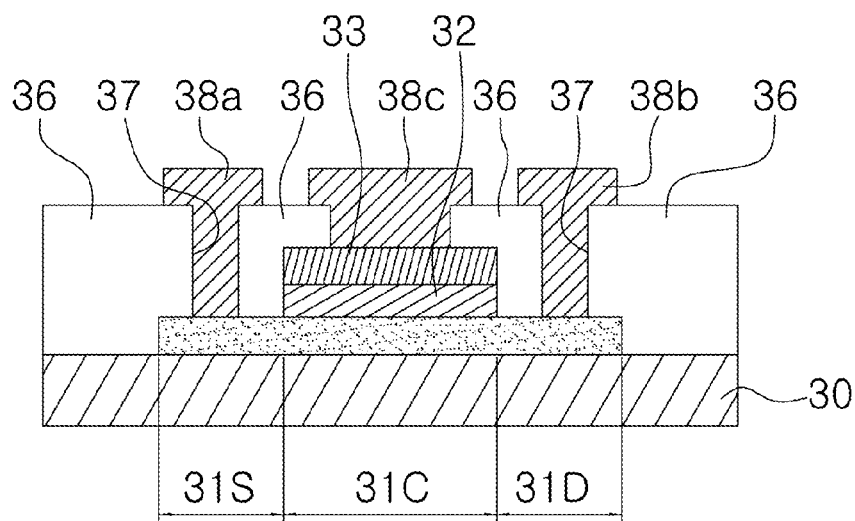

Then, as shown in FIG. 2F, an interlayer insulation film 36 is formed on the entire surface of the substrate, and a contact hole 37 is formed for the source region 31S, the drain region 31D, and the gate electrode 33, respectively, using a contact mask (not shown). Then, a wiring metal film is deposited, and then patterned using a metal wiring mask, to thereby form the source, drain and gate metal wirings 38a-38c.

Also, the contact holes 34a are formed and then the MILC metal film 35 is deposited as shown in FIG. 2C. Accordingly, seeds of the MILC metal films 35a and 35b are formed to then perform a heat treatment as shown in FIG. 2D. Since an area to be crystallized between each seed and the channel region 31C is wide, a crystallization speed is very slow when a conventional N-type thin film transistor (TFT) whose source and drain regions are doped with N-type impurities is fabricated. As a result, it takes very long to perform a heat treatment, and thus it is nearly impossible to apply the heat treatment to fabrication of the N-type TFT.

However, MIC and MILC are accomplished at the state where impurities are not doped, that is, at an intrinsic state, at the time of a primary heat treatment in the present invention. Thus, although an area to be crystallized between each of the MILC metal films 35a and 35b and the channel region 31C is wide, a crystallization speed is very fast, and thus it takes short to perform a heat treatment. As a result, a considerable portion of the semiconductor layer 31 whose entire portions are crystallized by the primary heat treatment is crystallized at a fast crystallization speed. In other words, the considerable portion of the semiconductor layer 31 is crystallized within a relatively short heat treatment time. Since only a remaining non-crystallized portion of the semiconductor layer 31 is crystallized in a secondary heat treatment at the state where N-type impurities are doped, a total heat treatment time is not long.

As a result, it is possible to use seeds of MILC metal films using the contact method even at the time of fabrication of the N-type TFT in the present invention. Accordingly, in the first embodiment of the present invention, a separate mask does not need to be fabricated in order to form seeds of the MILC metal films 35a and 35b, but a contact mask which is essentially fabricated in order to form a contact window with respect to the source and drain regions is used for fabricating a thin film transistor (TFT), to thereby form a photosensitive film pattern 34 having contact holes 34a and 34b with respect to the source and drain regions.

Further, in the case of the conventional heat treatment method, boron (B) such as $B_2H_4$, or phosphorus (P) such as $PH_3$ are doped into portions where the source and drain regions of a semiconductor layer made of amorphous silicon, and then crystallization of the amorphous silicon and activation of the impurities are simultaneously accomplished at a one-time crystallization.

Figure 3A:
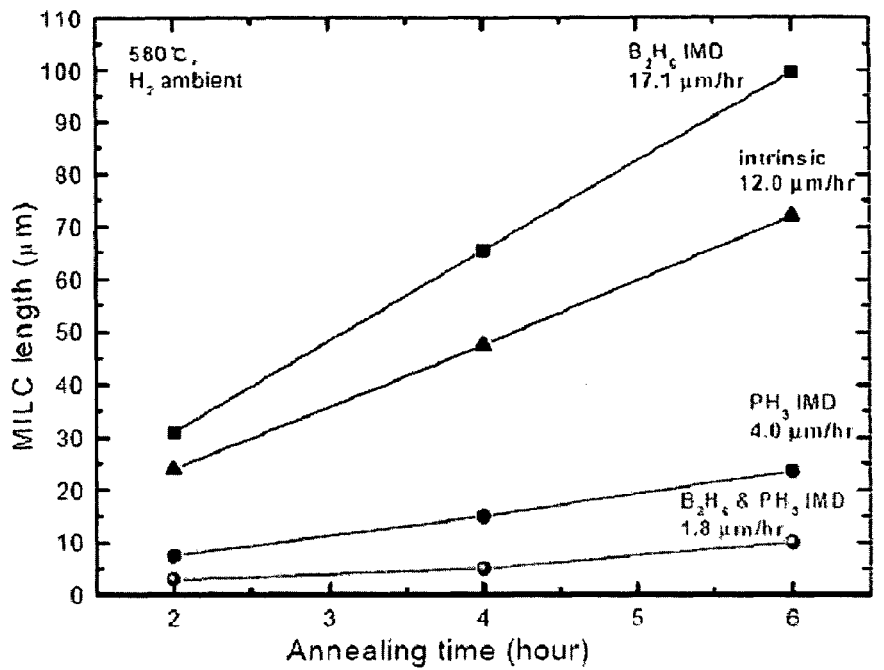
FIGS. 3A and 3B are graphical views for comparing MILC growth velocities according to the kinds of impurities doped when heat treatment temperatures are 580° C. and 550° C., respectively.
Figure 3B:
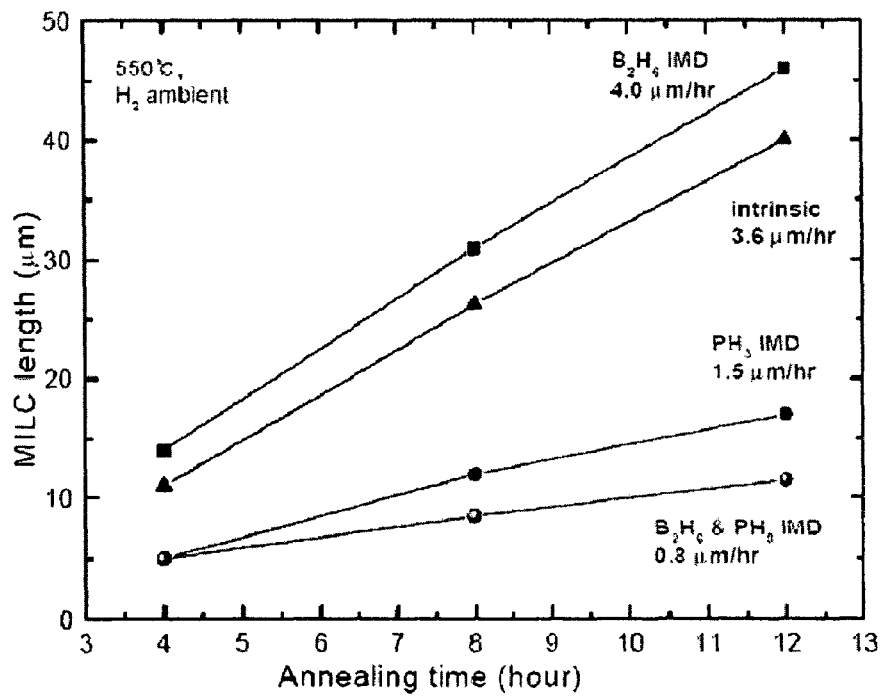

In this case, as can be seen from FIGS. 3A and 3B, a crystallization speed of the case that P is doped into an amorphous silicon is greatly reduced in comparison with the intrinsic case that no impurities are doped. Thus, in the case that a TFT where B and P are doped and a driver integrated circuit (IC) for driving a liquid crystal display (LCD) exist in a single panel, two TFTs are simultaneously crystallized, and a heat treatment time for crystallization depends upon one TFT whose crystallization speed is slower than that of the other TFT. Thus, although a crystallization speed is fast in the case of a TFT where B is doped, a total crystallization time of a panel becomes very slow due to a TFT where P is doped.

Meanwhile, in the case of the present invention which crystallizes an amorphous semiconductor thin film by a double heat treatment, a primary heat treatment is accomplished before impurities such as phosphorus (P) are doped, and a secondary heat treatment is accomplished after impurities are doped. Thus, since an amorphous semiconductor thin film is at an intrinsic state in the case of the primary heat treatment, a fast growth speed is retained to thereby shorten a crystallization time.

Hereinbelow, a difference between a heat treatment time according to the conventional art and that of the first embodiment of the present invention will be described in more detail.

Figure 1A:
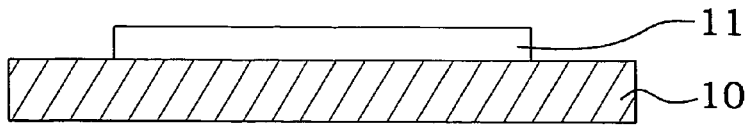
FIGS. 1A through 1F are cross-sectional views for explaining a method of fabricating a conventional low-temperature poly-crystalline semiconductor thin film transistor using a MILC method.
Figure 1B:
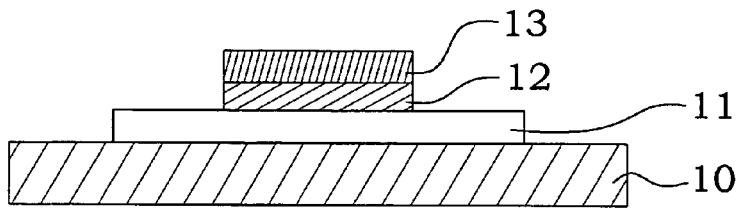
Figure 1C:
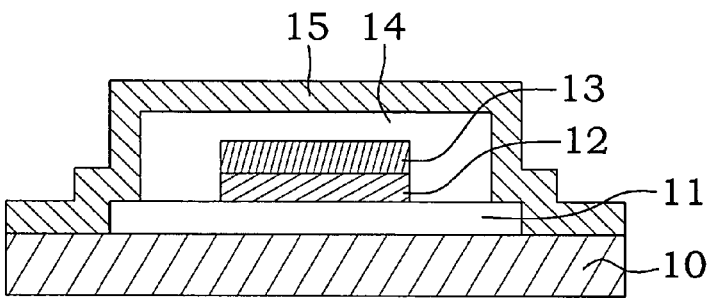
Figure 1D:
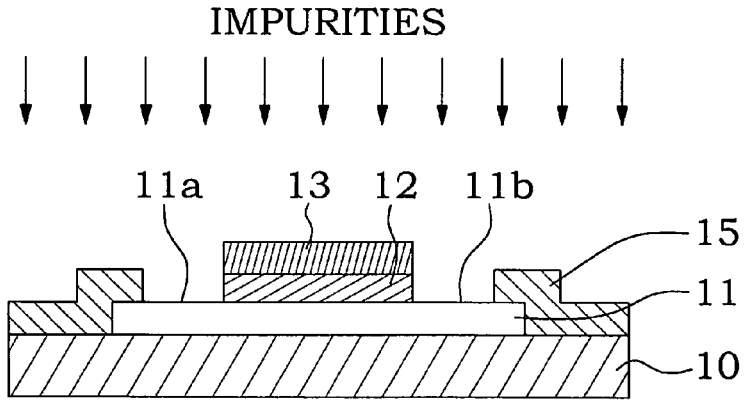
Figure 1E:
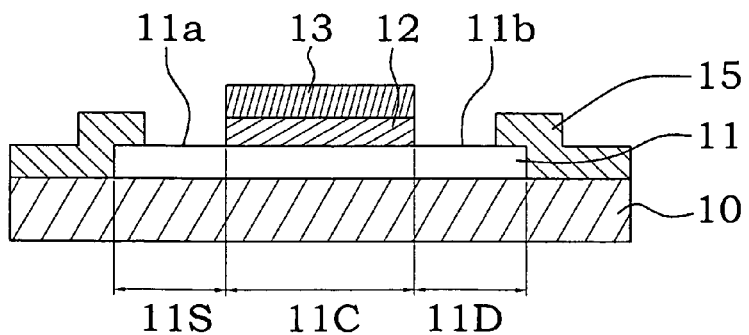
Figure 1F:
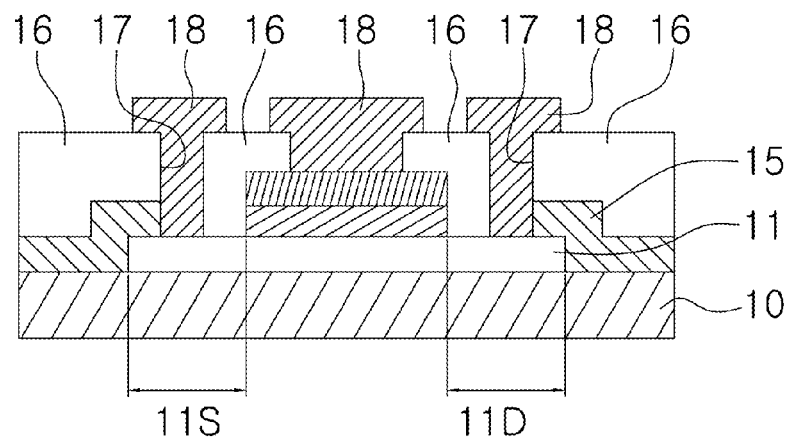

First, it is assumed that a length of the channel region 11C in a TFT is 24 μm, and a distance from the MILC metal film 15 to the channel shell portion (that is, the gate insulation film 12), that is, the length of the off-set portions 11a and 11b in the semiconductor layer 11 is 12 μm, in FIG. 1E illustrating the conventional heat treatment method. Then, if a heat treatment temperature is set 580° C., it can be seen that a crystallization speed is 4 μm/hr in the case that phosphorous (P) is doped and a crystallization speed at the intrinsic state is 12 μm/hr.

If a heat treatment is executed at 580° C., a crystallization time of three hours is needed since the off-set portions 11a and 11b from the metal film 15 to the channel shell portion are doped with phosphorous (P). Meanwhile, since the channel region 11C is at an intrinsic state, and thus metal induced lateral crystallization (MILC) is executed at both sides, it takes one hour to completely crystallize the channel region 11C. Thus, a total crystallization time according to the conventional heat treatment method needs four hours.

Referring to FIG. 2D in the present invention, a crystallization is executed up to the vicinity of the channel shell portion, that is, for the off-set portion, through a primary heat treatment at 580° C. In this case, since the off-set portion is at an intrinsic state where impurities are not doped, a crystallization speed is 12 μm/hr. Thus, the primary heat treatment time needs one hour. Then, a secondary heat treatment is executed at 580° C. at the state where phosphorous (P) is injected as high-purity impurities as shown in FIG. 2E, to thereby crystallize a remaining channel region 31C. In this case, since the channel region 31C of 24 μm is at an intrinsic state, one hour is needed as a heat treatment time. Thus, the present invention completes the crystallization through the heat treatment for only a total two hours which is a sum of the primary and secondary heat treatment times. As a result, the present invention accomplishes the heat treatment two times as fast as the case of the conventional heat treatment method which needs a total four hours.

Hereinbelow, a method of fabricating a thin film transistor using a MILC method according to a second embodiment of the present invention will be described with reference to FIGS. 4A through 4G.

Figure 4A:
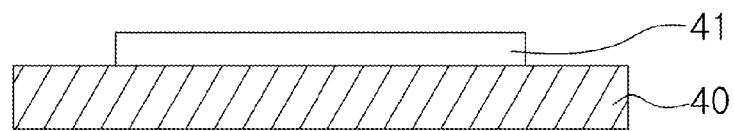
FIGS. 4A through 4G are cross-sectional views for explaining a method of fabricating a thin film transistor using a MILC method according to a second preferred embodiment of the present invention.

Referring to FIG. 4A, an amorphous silicon thin film is deposited on a transparent insulation substrate 40, through a CVD (Chemical Vapor Deposition) or sputtering method and then patterned using a mask (not shown) for forming a semiconductor layer, to thereby form a semiconductor layer 41.

Figure 4B:
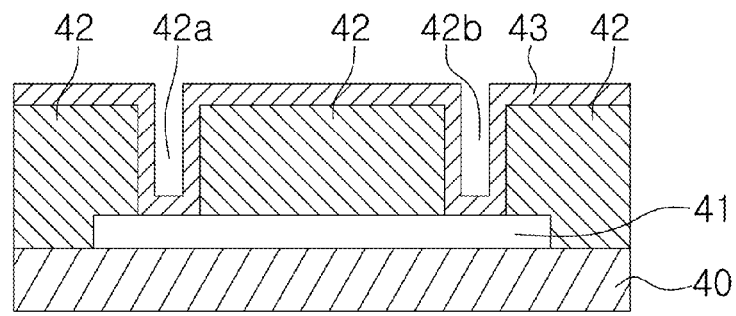

Then, as shown in FIG. 4B, a photosensitive film pattern 42 having contact holes 42a and 42b with respect to a source region and a drain region is formed on the substrate 40 using a mask (not shown), and then a MILC metal film 43 is deposited on the entire surface of the substrate 40. As a result, the MILC metal film 43 contacts partially the source and drain regions via the contact holes 42a and 42b.

The MILC metal film 43 is deposited with a thickness of 10~10,000 Å, preferably, 10~200 Å, on the insulation substrate 40, by any one of sputtering, evaporation by heating, PECVD (Plasma Enhanced Chemical Vapor Deposition), and a solution coating. Here, as the applicable material of the metal film 43 is any one selected from the group consisting of Ni, Pd, Ti, Ag, Au, Al, Sn, Sb, Cu, Co, Cr, Mo, Tr, Ru, Rh, Cd, and Pt, which is the same material as that of the MILC metal film 35 of the first embodiment of the present invention.

Figure 4C:
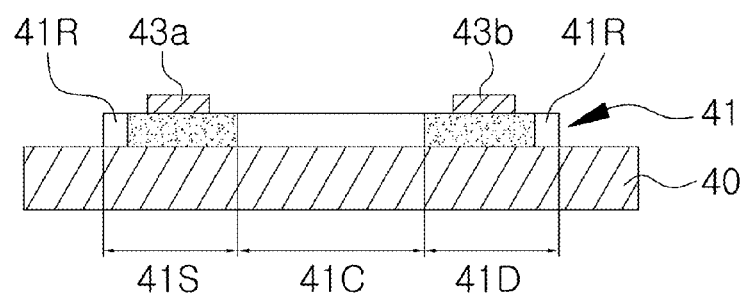

Then, if the photosensitive film pattern 42 is removed from the insulation substrate 40 by a lift-off method, only MILC metal films 43a and 43b partially contacting the source and drain regions 41S and 41D remain as shown in FIG. 4C, and the other metal films are removed, to thereby have the upper surface of the substrate exposed. The remaining MILC metal films 43a and 43b play a role of seeds for MILC.

In this state, the substrate is primarily heat-treated for one hour at a temperature of 400 through 600° C., for example, at a temperature of 580° C. Accordingly, part of the semiconductor layer 41 made of an amorphous semiconductor thin film, that is, the lower portion of the MILC metal films 43a and 43b are crystallized by the MIC method, and part of the exposed semiconductor layer 41 is crystallized by the MILC method. That is, a pattern length, a formation position, and a heat treatment time of the MILC metal films 43a and 43b are established so that the channel region 41C below the gate insulation film and the outer shell portion 41R of the semiconductor layer 41 remain as an amorphous silicon state. Then, the remaining MILC metal films 43a and 43b which react with the silicon by the heat treatment but are not transformed into silicide are removed.

Figure 4D:
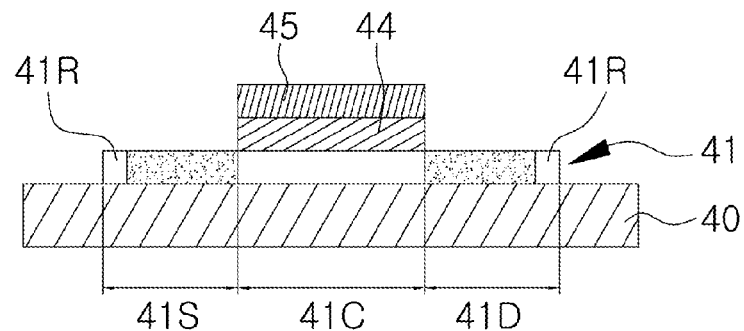

Then, as shown in FIG. 4D, a gate oxide film and a gate electrode metal material are sequentially formed on the insulation substrate 40, and then patterned using a gate formation mask (not shown), through a CVD or sputtering method, to thereby form a gate electrode 45 and a gate insulation film 44 so as to be located above the channel region 41C.

Figure 4E:
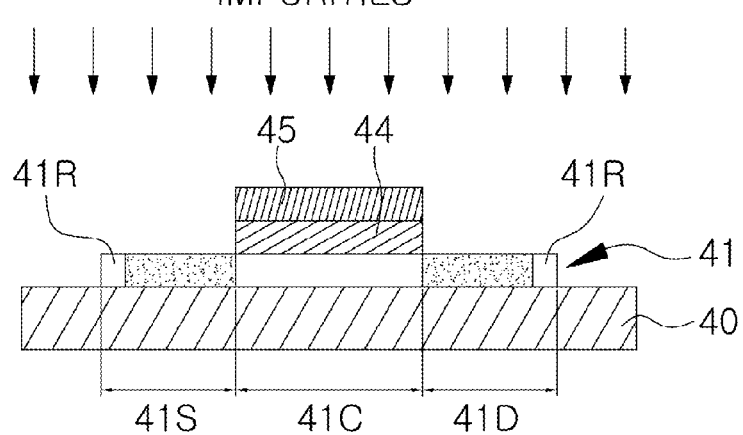

Referring to FIG. 4E, high-concentration impurities, for example, P (in case of an N-type) or B (in case of a P-type) is ion-injected into the semiconductor layer 41 exposed by a self-aligning manner, using the gate electrode 45 as a mask on the substrate 40 to thereby form the source region 41S and the drain region 41D.

Figure 4F:
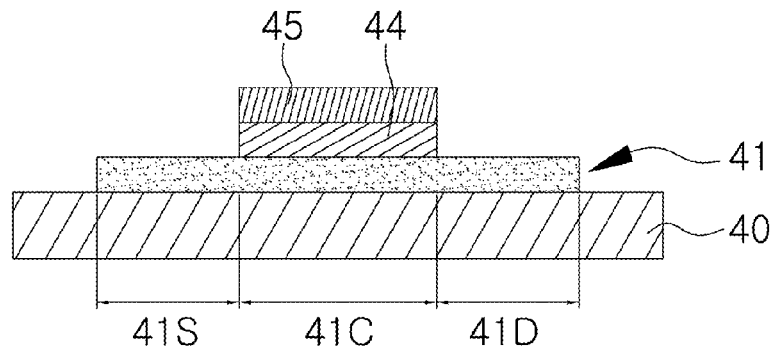

Then, Referring to FIG. 4F, the substrate is secondarily heat-treated for one hour by the MILC method, at a temperature of 400 through 600° C., for example, at a temperature of 580° C. Accordingly, the MILC crystallization is completed for the channel region 41C and the outer shell portion 41R of the semiconductor layer 31 which remain as an amorphous silicon state, and the ion-injected dopant is activated.

Figure 4G:
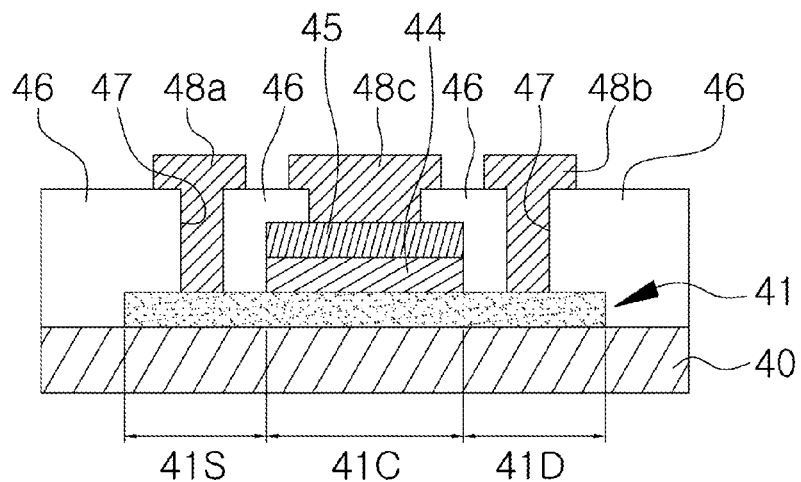

Then, as shown in FIG. 4G, an interlayer insulation film 46 is formed on the entire surface of the substrate, and a contact hole 47 are formed for the source region 41S, the drain region 41D, and the gate electrode 45, respectively, using a contact mask (not shown). Then, a wiring metal film is deposited, and then patterned using a metal wiring mask, to thereby form the source, drain and gate metal wirings 48a-48c.

The second embodiment of the present invention is same as the first embodiment thereof, from the viewpoint of performing a two-step heat treatment such as a primary heat treatment and a secondary heat treatment respectively before and after ion-injection of impurities. However, the former differs from the latter, in view of performing the primary heat treatment before the gate insulation film and the gate electrode are formed.

Thus, similarly to the first embodiment of the present invention, the second embodiment thereof can reduce a total heat treatment time necessary for the primary and secondary heat treatments, into a half in the case of an N-type TFT where phosphorous (P) is doped in comparison with the conventional single heat treatment method.

Also, although the second embodiment of the present invention proposed processes of executing the primary heat treatment for one hour to thus crystallize part of the semiconductor layer 41 made of an amorphous silicon, executing the secondary heat treatment for one hour to thus crystallize the other portions of the semiconductor layer 41, and activating the ion-injected dopant. However, it is possible to transform the second embodiment of the present invention into processes of completing MIC and MILC methods for all semiconductor layers 41 at the time of the primary heat treatment and only activating the ion-injected dopant at the time of the secondary heat treatment.

Although the above-described modified heat treatment is executed, crystallization is completed at a fast crystallization speed since the primary heat treatment is executed before impurities such as phosphorous (P) are ion-injected, and then since a secondary heat treatment for activating impurities is executed, a total heat treatment time becomes shorter than that of the conventional heat treatment method which executes a one-time heat treatment after impurities are injected.

Further, the entire semiconductor layer is crystallized at the time of the primary heat treatment before the impurities are doped. Then, the gate insulation film and the gate electrode are formed. Thereafter, the secondary heat treatment after impurities are doped is executed to activate the injected impurities. In this case, since a heat treatment for crystallizing an amorphous silicon is completed an advance before the gate insulation film is formed. Accordingly, an interfacial surface between the amorphous semiconductor thin film the gate insulation film (oxide film) can be deteriorated at minimum.

That is, the thin film transistor fabrication method according to the second embodiment of the present invention performs a crystallization heat treatment at the state where a gate insulation film is formed on the semiconductor layer of the amorphous silicon. In this case, the present invention can prevent a surface roughness from worsening and a trap site from being formed due to a mechanical stress between a semiconductor layer and a gate insulation film, since the amorphous silicon film is crystallized.

Also, since the photosensitive film pattern 43 having contact holes 42a and 42b with respect to the source and drain regions necessary to form the MILC metal films 43a and 43b using a contact mask as shown in FIG. 4B in the second embodiment of the present invention can be formed, a separate mask does not need to be fabricated. Also, a leakage current feature and an on-current feature of a completed TFT can be enhanced according to a perfect crystallization due to the double heat treatment method.

Hereinbelow, a method of fabricating a thin film transistor using a MILC method according to a third embodiment of the present invention will be described with reference to FIGS. 5A through 5F.

Figure 5A:
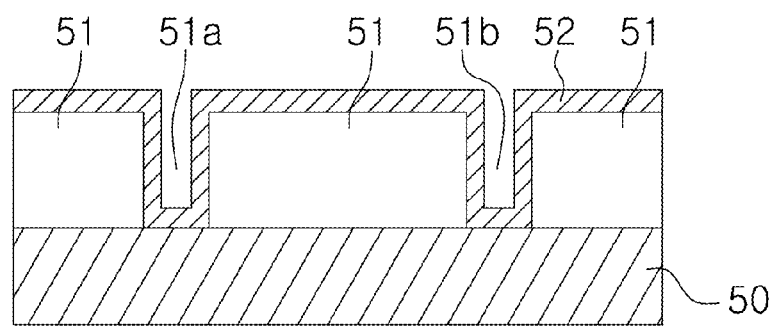
FIGS. 5A through 5F are cross-sectional views for explaining a method of fabricating a thin film transistor using a MILC method according to a third preferred embodiment of the present invention.

Referring to FIG. 5A, a photosensitive film is deposited on a transparent insulation substrate 50, and then patterned using a mask (not shown), to thereby form a photosensitive film pattern 51 in which first and second contact holes 51a and 51b for the source and drain reservation regions are disposed at a predetermined interval.

Then, a MILC metal film 52 is deposited on the entire surface of the substrate 40 where the photosensitive film pattern 51 has been formed. As a result, the MILC metal film 52 contacts partially the source and drain reservation regions via the contact holes 51a and 51b.

The MILC metal film 52 is deposited with a thickness of 10~10,000 Å, preferably, 10~200 Å, on the insulation substrate 40, by any one of sputtering, evaporation by heating, PECVD (Plasma Enhanced Chemical Vapor Deposition), and a solution coating. Here, the applicable material of the metal film 52 is any one selected from the group consisting of Ni, Pd, Ti, Ag, Au, Al, Sn, Sb, Cu, Co, Cr, Mo, Tr, Ru, Rh, Cd, and Pt, which is the same material as that of the MILC metal film 35 of the first embodiment of the present invention.

Figure 5B:
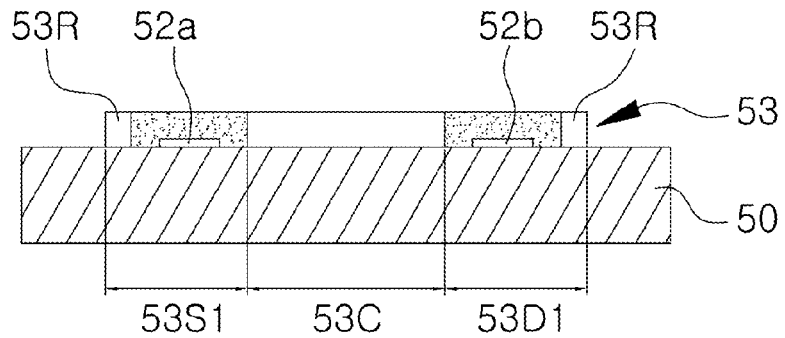

Then, if the photosensitive film pattern 51 is removed from the insulation substrate 50 by a lift-off method, only MILC metal films 52a and 52b partially contacting the source and drain reservation regions 53S1 and 53D1 remain as shown in FIG. 5B, and the other metal films are removed, to thereby have the upper surface of the substrate exposed. The remaining MILC metal films 52a and 52b play a role of seeds for MILC.

Then, an amorphous silicon film is deposited within a thickness of 20-300 nm, preferably, 60-100 nm, on a substrate where the MILC metal films 52a and 52b are formed at intervals through a CVD or sputtering method, and the amorphous silicon film is patterned using a semiconductor formation mask (not shown), to thereby form a semiconductor layer 53.

In this state, the substrate is primarily heat-treated for one hour at a temperature of 400 through 600° C., for example, at a temperature of 580° C. Accordingly, part of the semiconductor layer 53 made of an amorphous silicon, that is, the upper portion of the MILC metal films 52a and 52b are crystallized by the MIC method, and part of the exposed semiconductor layer 53 is crystallized by the MILC method. That is, a pattern length, a formation position, and a heat treatment time of the MILC metal films 52a and 52b are established so that the channel reservation region 51C below the gate insulation film which is formed at a following step, and the outer shell portion 53R of the semiconductor layer 53 remain as an amorphous semiconductor thin film state. Then, the thickness of the MILC metal films 52a and 52b is properly selected. Accordingly, it is preferable that the remaining MILC metal films 52a and 52b react with the silicon by the heat treatment and transformed into silicide, so that the remaining metal films 52a and 52b do not remain.

As described above, in the case of the first through third embodiments, the pattern length, the formation position, and the heat treatment time of the MILC metal films are established and partially crystallized so that the channel region and the outer shell portion of the semiconductor layer remain according to the primary heat treatment. However, the present invention is not limited thereto. For example, at the time of the primary heat treatment, crystallization can be done up to a part of the channel region. Also, it is not necessary to perform crystallization so that the outer shell portion of the semiconductor layer necessarily remains. That is, a non-crystallization region may remain at the time of the primary heat treatment in a degree that the non-crystallization region can be crystallized simultaneously during a heat treatment of the non-crystallized channel region by the secondary heat treatment. Such a degree is determined according to an efficient assignment of the primary and secondary heat treatment times in order to shorten a total heat treatment time.

Figure 5C:
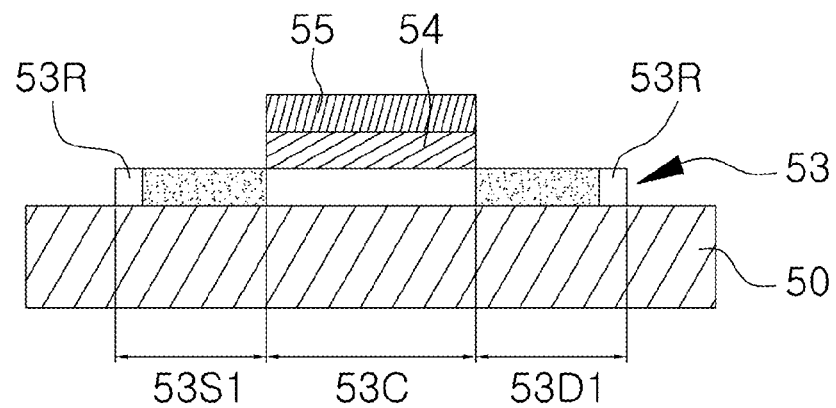

Referring to FIG. 5C, a gate oxide film and a gate electrode metal material are sequentially deposited on the insulation substrate 50, and then patterned using a gate formation mask (not shown), through a CVD or sputtering method, to thereby form a gate electrode 55 and a gate insulation film 54 so as to be located above the channel reservation region 53C.

Figure 5D:
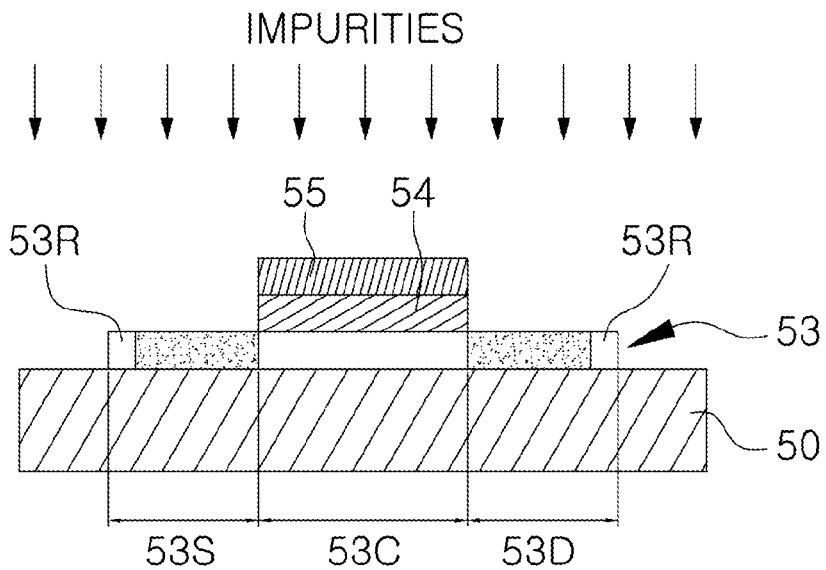

Then, as shown in FIG. 5D, high-concentration impurities, for example, P (in case of an N-type) or B (in case of a P-type) is ion-injected into the source and drain reservation regions 53S1 and 53D1 of the semiconductor layer 53, using the gate electrode 55 as a mask on the substrate 50 to thereby form the source region 53S and the drain region 53D.

Figure 5E:
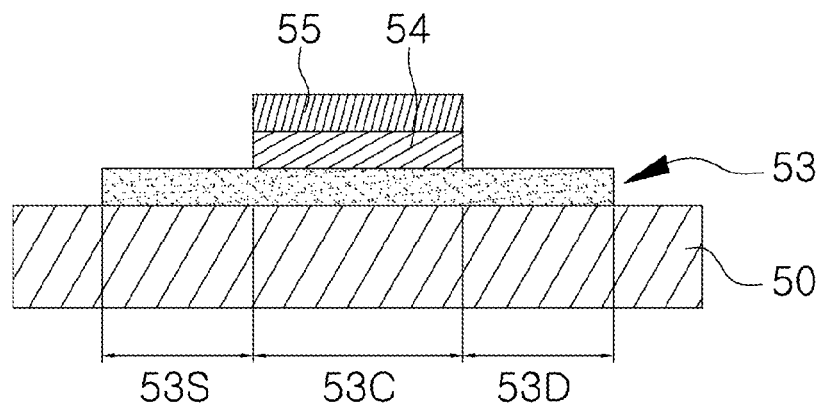

Then, referring to FIG. 5E, the substrate is secondarily heat-treated for one hour by the MILC method, at a temperature of 400 through 600° C., for example, at a temperature of 580° C. Accordingly, the MILC crystallization is completed for the channel region 53C and the outer shell portion 53R of the semiconductor layer 53 which remain as an amorphous silicon state. As a result, the crystallization for all the source and drain regions 53S and 53D and the channel region 53C is completed, and the ion-injected dopant is activated.

Figure 5F:
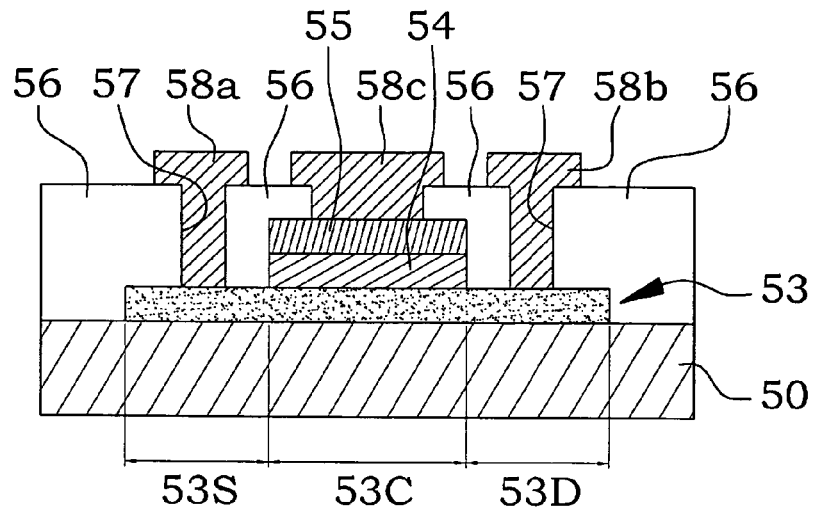

Then, as shown in FIG. 5F, an interlayer insulation film 56 is formed on the entire surface of the substrate, and a contact hole 57 are formed for the source region 53S, the drain region 53D, and the gate electrode 55, respectively, using a contact mask (not shown). Then, a wiring metal film is deposited, and then patterned using a metal wiring mask, to thereby form the source, drain and gate metal wirings 58a-58c.

Since the third heat treatment method performs the primary heat treatment at the state where the MILC metal films 52a and 52b are formed below the amorphous silicon film forming the semiconductor layer 53, the amorphous silicon film above the MILC metal films 52a and 52b is firstly formed into silicide by the MIC method and the silicide propagates to the amorphous silicon region to thereby crystallize the amorphous silicon by the MILC method.

Here, the thickness of the MILC metal films 52a and 52b is properly selected. Accordingly, both the MILC metal films 52a and 52b are completely formed into silicide. In this manner, since the remaining metal does not exist after the metal is formed into silicide, the MILC metal can be prevented from being diffused into the interface between the gate insulation film and the channel region 53C of the semiconductor layer 53.

That is, the third embodiment of the present invention fundamentally solves the problem that the interface between the gate insulation film and the channel region 53C of the semiconductor layer 53 can be polluted due to the remaining MILC metal, to accordingly solve the problem of deteriorating an electrical feature of a semiconductor device such as a transistor by the pollution due to the remaining metal. Further, even in the case that metal is not completely formed into silicide but the remaining metal exists, an influence upon the surface of the operating region of the transistor can be minimized since the remaining metal is located below the semiconductor layer.

Also, the third embodiment of the present invention is same as the first and second embodiments thereof, from the viewpoint of performing a two-step heat treatment such as a primary heat treatment and a secondary heat treatment respectively before and after ion-injection of impurities. Thus, similarly to the first and second embodiments of the present invention, the third embodiment thereof can reduce a total heat treatment time necessary for the primary and secondary heat treatments into a half in the case of an N-type TFT where phosphorous (P) is doped in comparison with the conventional single heat treatment method.

Also, since the photosensitive film pattern 51 necessary to form the MILC metal films 52a and 52b using a contact mask in the third embodiment of the present invention can be formed, a separate mask does not need to be fabricated. Also, a leakage current feature and an on-current feature of a completed TFT can be enhanced according to a perfect crystallization due to the double heat treatment method.

Meanwhile, the first through third embodiments have proposed a structure having no need to prefabricate a separate mask since an existing contact mask is used to form the MILC metal films.

However, a MILC metal film pattern having a proper off-set distance on a semiconductor layer can be formed by using a separate mask in order to define a size and position of the MILC metal film pattern as in the following fourth embodiment. Then, it is possible to form a LDD (Lightly Doped Drain) structure by way of a double heat treatment.

Hereinbelow, a method of fabricating a thin film transistor using a MILC method according to a fourth embodiment of the present invention will be described with reference to FIGS. 6A through 6C.

Figure 6A:
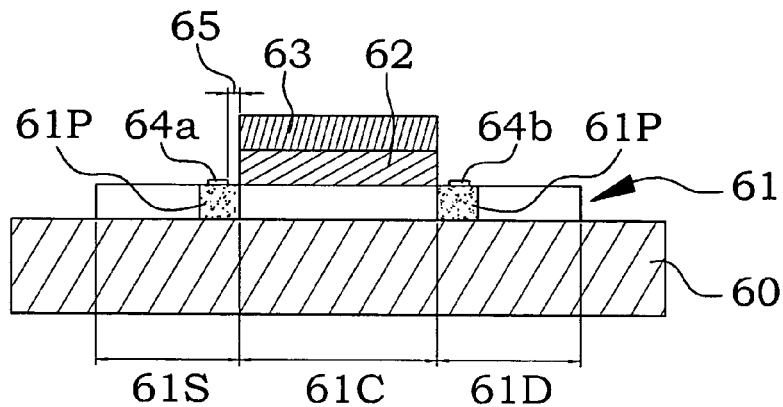
FIGS. 6A through 6C are cross-sectional views for explaining a method of fabricating a thin film transistor using a MILC method according to a fourth preferred embodiment of the present invention.

Referring to FIG. 6A, a MILC metal film pattern is deposited on source and drain regions 61S and 61D of a semiconductor layer 61 so as to have a proper off-set distance 65 between the MILC metal film pattern and the gate insulation film 62 by using a separate mask instead of forming a MILC metal film pattern using a contact mask as in the first through third embodiments.

That is, as shown in FIG. 6A, a photosensitive film pattern having a contact window partially contacting the source region 61S and the drain region 61D of the semiconductor layer 61 made of an amorphous silicon is formed and then a MILC metal film is deposited thereon. Then, the photosensitive film pattern is removed by a lift-off method, to thereby form the MILC metal film patterns 64a and 64b.

Then, a primary heat treatment is executed relatively shortly using the MILC metal film patterns 64a and 64b, to thereby crystallize part of portions to be formed as the source region 61S and the drain region 61D into poly-crystalline semiconductor thin films 61P, and form a gate insulation film 62 and a gate electrode 63 in the same manner as the second embodiment.

That is, a gate oxide film and a gate electrode metal material are sequentially deposited on the insulation substrate 60, and then patterned using a gate formation mask (not shown), through a CVD or sputtering method, to thereby form a gate electrode 63 and a gate insulation film 62 so as to be located above the channel reservation region 61C.

Figure 6B:
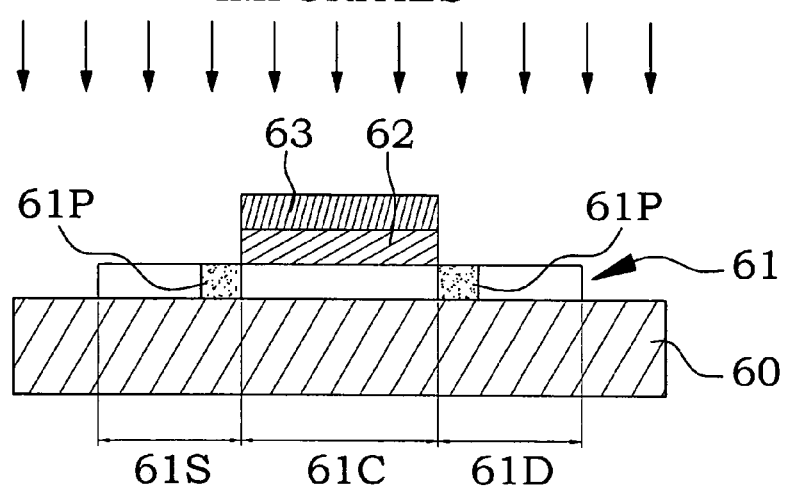

Then, as shown in FIG. 6B, high-concentration impurities are ion-injected into the source and drain regions 61S and 61D on the substrate, using the gate electrode 63 as a mask.

Figure 6C:
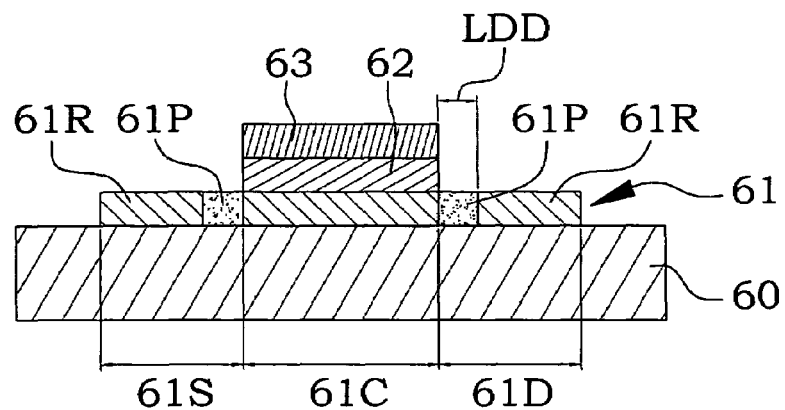

Then, referring to FIG. 6C, the substrate is secondarily heat-treated by the MILC method, at a temperature of 400 through 600° C. Accordingly, the crystallization for the source region 61S, the drain region 61D, and the channel region 61C is completed and the ion-injected dopant is activated.

That is, the injected dopants are activated at the poly-crystalline state in the region 61P which has been crystallized before the ion-injection at the time of activating dopants, and dopants are injected at an amorphous silicon state in the region 61R to be crystallized after the ion-injection, to then crystallize amorphous silicon into poly-crystalline silicon and activate the dopants.

Thus, the thin film transistor (TFT) fabricated through the fourth embodiment of the present invention forms a LDD (Lightly Doped Drain) structure which is necessarily needed to accomplish low leakage current. Reportedly, it has been known that an activating energy necessary for activating a dopant in the case that impurities are ion-injected after crystallization of an amorphous silicon is higher than that in the case that crystallization is accomplished after ion-injection.

Thus, partial crystallization is executed at a portion where a LDD region is formed by primary heat treatment as in the fourth embodiment. Then, at this state, impurities are ion-injected and secondary heat treatment is executed. As a result, as shown in FIG. 6C, the region 61P crystallized before the ion-injection and the region 61R crystallized after the ion-injection co-exists together with the source region 61S and the drain region 61D.

In this state, an activating energy of a dopant is high at the region 61P crystallized before the ion-injection while that is relatively low at the region 61R crystallized after the ion-injection. As a result, since resistance of the region 61P crystallized before the ion-injection is relatively larger than that of the region 61R crystallized after the ion-injection, the thin film transistor (TFT) fabricated through the fourth embodiment of the present invention is incorporated with a LDD (Lightly Doped Drain) structure without adding a separate process. Also, a leakage current feature and an on-current feature of a completed TFT can be enhanced according to perfect crystallization due to the double heat treatment method.

The double heat treatment method of the TFT having a LDD structure according to the fourth embodiment is modified from the double heat treatment process of the second embodiment. Similarly, TFTs each having a LDD structure can be fabricated by a double heat treatment method which is modified from those of the first and third embodiments.

In other words, in order to form a LDD structure of the fourth embodiment, a separate mask is used instead of a contact mask as shown in FIG. 2C when MILC metal film patterns are formed and patterned according to the first embodiment of the present invention. Also, in this manner, MILC metal film patterns are formed using a separate mask as shown in FIG. 5A in the case of the third embodiment. Accordingly, a LDD structure can be formed by a double heat treatment.

Figure 7:
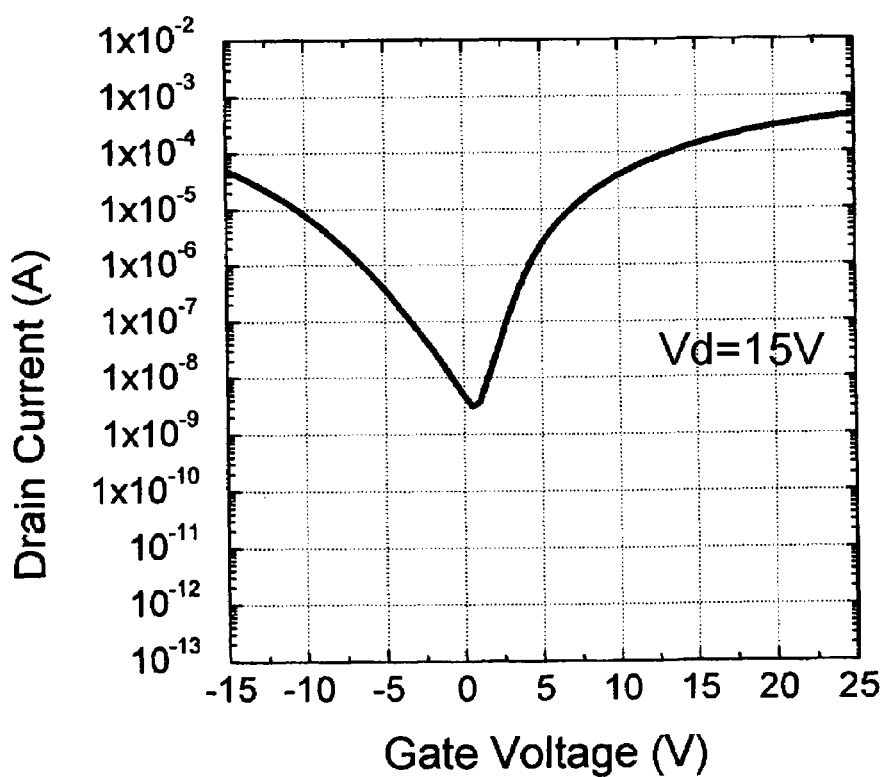
FIG. 7 is a graph showing an I-V curve of an N-type thin film transistor formed through a conventional MILC.
Figure 8:
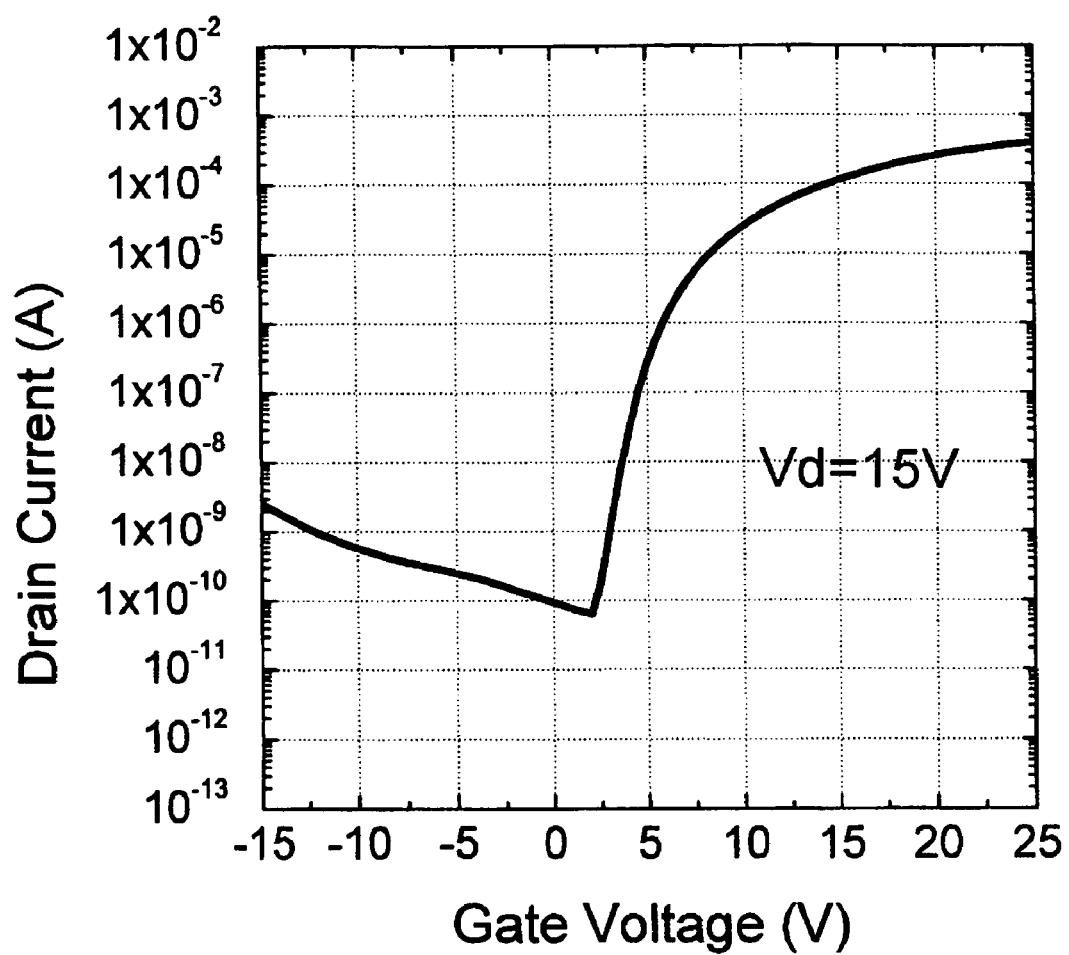
FIG. 8 is a graph showing an I-V curve of an N-type thin film transistor fabricated by the fourth embodiment of the present invention.

FIG. 7 is a graph showing an I-V curve of an N-type thin film transistor formed through a conventional MILC shown in FIGS. 1A through 1F, in which crystallization of a semiconductor layer and activation of a dopant is accomplished by a single-time heat treatment. FIG. 8 is a graph showing an I-V curve of an N-type thin film transistor fabricated to have a LDD structure using a two-times divided heat treatment by the fourth embodiment of the present invention.

Although only a heat treatment time and the number of times of heat treatment are changed but and fabricated in the same processing condition as that of the conventional art and heat-treated at the same time and temperature, a thin film transistor (TFT) formed by the conventional heat treatment as shown in FIG. 7 has bad electrical features, while a thin film transistor (TFT) fabricated by the present invention shows a small leakage current feature and a high on-current feature. The reason why leakage current becomes extremely small in the present invention is not only because crystallization is perfectly accomplished but also because a LDD structure is naturally formed in a TFT of the present invention.

As described above, even in the case that an N-type semiconductor is included in activation area of source and drain regions, a heat treatment is executed before and after impurities are ion-injected in the present invention. Accordingly, fast crystallization is accomplished entirely, to thereby easily fabricate an N-type TFT. Thus, an N-type TFT can be formed for a half the heat treatment time together with a P-type TFT, in comparison with the conventional art. As a result, the present invention is particularly advantageous for formation of a driving circuit which is integrally formed on a liquid crystal display (LCD) panel.

Also, since the region crystallized before the ion-injection and the region crystallized after the ion-injection co-exist according to the double heat treatment, the thin film transistor (TFT) fabricated according to the present invention is incorporated with a LDD (Lightly Doped Drain) structure without adding a separate process. Also, a leakage current feature and an on-current feature of a completed TFT can be enhanced according to perfect crystallization due to the double heat treatment method.

Further, a thickness of a MILC metal film seed is properly selected and formed below an amorphous semiconductor thin film so that the entire MILC metal films are made into silicide completely, and no remaining metal is left over. Accordingly, a problem of deteriorating an electrical feature of a semiconductor device due to pollution of the remaining metal can be solved.

As described above, the preferable embodiment of the present invention has been described with reference to the accompanying drawings. However, the present invention is not limited to the above-described embodiment. It is apparent to one who has an ordinary skill in the art that there may be many modifications and variations within the same technical spirit of the invention.

What is claimed is:

1. A method of fabricating thin film transistor using a crystallized amorphous semiconductor thin film, the method comprising the steps of:
    forming an amorphous semiconductor thin film on a substrate;
    forming at least one crystallization induced metal pattern at a predetermined location on the upper portion of the amorphous semiconductor thin film;
    performing a first crystallization of said amorphous semiconductor thin film by a first heat treatment of said amorphous semiconductor thin film thereby crystallizing said amorphous semiconductor thin film in a vicinity of said predetermined location of said at least one crystallization induced metal pattern, including crystallization of said amorphous semiconductor thin film at an area thereof beneath and covered by said at least one crystallization induced metal pattern via a MIC (Metal Induced Crystallization) method, and crystallization of said amorphous semiconductor thin film laterally adjacent to said area thereof via a MILC (Metal Induced Lateral Crystallization) method, respectively, a portion of said amorphous semiconductor thin film remaining in an amorphous state after said first crystallization, forming a partially crystallized amorphous semiconductor thin film;
    selectively injecting N-type impurities into said partially crystallized amorphous semiconductor thin film subsequent to said first crystallization by said first heat treatment to form a source region and a drain region of the thin film transistor; and
    performing a second crystallization of said partially crystallized amorphous semiconductor thin film by a second heat treatment of said partially crystallized amorphous semiconductor thin film via the MILC method subsequent to said N-type impurity injection,
    wherein said second crystallization crystallizes said partially crystallized amorphous semiconductor thin film in a channel region defined in said portion of said partially crystallized amorphous semiconductor thin film remaining in the amorphous state between said source region and said drain region.

2. The method according to claim 1, further comprising the steps of:
    sequentially forming an insulation film and a conductive metal film on the substrate before forming the at least one crystallization induced metal pattern; and
    sequentially patterning the insulation film and the conductive metal film to form a gate electrode and a gate insulation film,
    wherein impurities are selectively ion-injected using the gate electrodes as a mask at the step of forming the source region and the drain region by ion-injecting N-type impurities into the substrate.

3. The method according to claim 1, further comprising the steps of:
    sequentially forming an insulation film and a conductive metal film on the substrate after forming the at least one crystallization induced metal pattern; and
    sequentially patterning the insulation film and the conductive metal film to form a gate electrode and a gate insulation film,
    wherein the gate electrode and the gate insulation film are formed in alignment with said portion of said partially crystallized amorphous semiconductor thin film remaining in the amorphous state after said first crystallization step between a pair of the crystallization induced metal patterns.

4. The method according to claim 1, wherein the step of forming said at least one crystallization induced metal pattern comprises the steps of:
    forming a photosensitive film on an entire surface of the substrate;
    forming a pair of contact holes on the photosensitive film to expose a part of regions where a source and a drain are formed as semiconductor layers;
    forming the at least one crystallization induced metal on the entire surface of the substrate; and
    removing the photosensitive film by a lift-off method to form the at least one crystallization induced metal pattern contacting a part of the source and drain regions.

5. The method according to claim 4, wherein contact holes for the said source region and said drain region are formed on the photosensitive film using a contact mask.

6. A method of fabricating a thin film transistor using a crystallized amorphous semiconductor thin film, the method comprising the steps of:
    forming at least a pair of crystallization induced metal patterns at predetermined locations on the upper portion of a substrate;

forming a semiconductor layer composed of an amorphous semiconductor thin film on the substrate, said at least pair of crystallization induced metal patterns being included therein;

performing a first crystallization of said semiconductor layer by a first heat treatment of said semiconductor layer, thereby crystallizing said semiconductor layer located above the upper portions of the pairs of crystallization induced metal patterns via a MIC (Metal Induced Crystallization) method and laterally adjacent thereto via a MILC (Metal Induced Lateral Crystallization) method, respectively, a portion of said semiconductor layer remaining in an amorphous state after said first crystallization step;

selectively injecting N-type impurities into partially crystallized said semiconductor layer to form a source region and a drain region of the thin film transistor; and performing a second crystallization of said semiconductor layer after said step of the impurities injection by a second heat treatment of said partially crystallized semiconductor layer via the MILC method, wherein said second crystallization crystallizes said partially crystallized semiconductor layer in a channel region remaining in the amorphous state after said first crystallization and defined between said source region and said drain region.

7. The method according to claim 6, wherein said pair of crystallization induced metal patterns are transformed into silicide during the first crystallization step.

8. A method of fabricating a poly-crystalline semiconductor thin film transistor, the poly-crystalline semiconductor thin film transistor fabrication method comprising the steps of:

depositing an amorphous semiconductor thin film on a transparent insulation substrate, and further patterning the deposited amorphous semiconductor thin film to thereby form an island-shaped semiconductor layer;

sequentially forming an insulation film and a electrode metal film on the substrate, and further sequentially patterning the insulation film and the electrode metal film, to thereby form a gate electrode and gate insulation film;

forming first and second crystallization induced metal patterns on a part of a source region and a drain region in the semiconductor layer, said first and second crystallization induced metal patterns being spaced a predetermined distance from the gate insulation film;

crystallizing by a first crystallization step a portion of the source region and the drain region, respectively, by a primary MILC (Metal Induced Lateral Crystallization) heat treatment method, using the first and second crystallization induced metal patterns, a non-crystallized channel region remaining in said semiconductor layer between said source and drain regions after said first crystallization step;

ion-injecting N-type impurities into the source region and the drain region after said first crystallization step; and crystallizing by a second crystallization step said non-crystallized channel region remaining in said semiconductor layer between the said source region and said drain region by a secondary MILC heat treatment method, the ion-injected impurities being activated during said second crystallization step.

* * * * *